US006975453B1

(12) United States Patent
Lippens et al.

(10) Patent No.: US 6,975,453 B1
(45) Date of Patent: Dec. 13, 2005

(54) MULTILAYER ELECTRICALLY CONDUCTIVE ANTI-REFLECTIVE COATING

(75) Inventors: Paul Lippens, Kortemark (BE); Peter Persoone, Deinze (BE)

(73) Assignee: Innovative Sputtering Technology, Zulte (BE)

( * ) Notice: Subject to any disclaimer, the term of this patent is extended or adjusted under 35 U.S.C. 154(b) by 0 days.

(21) Appl. No.: 09/529,973

(22) PCT Filed: Oct. 27, 1998

(86) PCT No.: PCT/EP98/06996

§ 371 (c)(1), (2), (4) Date: Apr. 24, 2000

(87) PCT Pub. No.: WO99/22253

PCT Pub. Date: May 6, 1999

(30) Foreign Application Priority Data

Oct. 29, 1997 (EP) ................................ 97203335

(51) Int. Cl.$^{7}$ ........................... B32B 9/00; B05D 5/12; G02B 27/22; G02B 5/28

(52) U.S. Cl. ..................... 359/469; 359/589; 359/586; 359/585; 359/472; 428/701; 428/702; 428/913; 427/97.1; 427/81; 427/126.3; 427/124

(58) Field of Search ............................... 428/213, 216, 428/336, 212, 64.2, 64.4, 64.9, 701, 702, 428/913; 369/287, 288; 359/469, 589, 586, 359/585, 472, 359; 427/97.1, 81, 126.3, 124

(56) References Cited

U.S. PATENT DOCUMENTS

| | | | | |
|---|---|---|---|---|
| 4,422,721 A | | 12/1983 | Hahn et al. | 350/164 |
| 5,270,858 A | | 12/1993 | Dickey | 359/586 |
| 5,450,238 A | | 9/1995 | Bjornard et al. | 359/580 |
| 5,508,091 A | | 4/1996 | Austin | 428/216 |
| 5,667,880 A | | 9/1997 | Okaniwa | 428/212 |
| 5,939,189 A | * | 8/1999 | Phillips et al. | 428/336 |

* cited by examiner

*Primary Examiner*—Rena Dye
*Assistant Examiner*—Lawrence Ferguson
(74) *Attorney, Agent, or Firm*—Foley & Lardner LLP

(57) ABSTRACT

The present invention comprises a multilayer inorganic anti-reflective coating with predetermined optical properties, for application on a flexible substrate. The coating comprises a stack consisting of five material layers, whereby the third layer is a dummy layer consisting of an electrically conductive material, preferably indium-tinoxyde, which provides the coating with an adjustable electrical sheet resistance of between 25 and 2000 Ω/sq without thereby influencing its optical properties. The anti-reflective coating can be applied onto a flexible substrate (e.g. a polymer film) by means of a single 12 or double pass vacuum magnetron sputtering operation.

12 Claims, 7 Drawing Sheets

MULTILAYER ELECTRICALLY CONDUCTIVE ANTI-REFLECTIVE COATING

The invention relates to a multilayer anti-reflective coating for application on a flexible substrate.

STATE OF THE ART

The performance of a multilayer anti-reflective coating can be evaluated from its admittance diagram and corresponding reflectance diagram.

In an admittance plot, the locus of the complex optical admittance Y of the stack constituting the anti-reflective coating is plotted in the complex plane, starting at the substrate and ending at the front surface of the stack—as if the admittance of the stack was plotted during the entire deposition process. For each dielectric layer being part of the stack, this locus is an arc of a circle centered on the real axis, and traced out clock-wise. Optimum anti-reflection properties of the full coating stack are obtained if the end of the admittance plot is near the point (1,0), which is the optical admittance of air, the entrance medium.

In a reflectance diagram, the percentage reflection of the incident light (hereafter called reflectance) is plotted as a function of its wave-length. The reflectance should be as low as possible over the visual wave-length range, roughly from about 400 to about 700 nm.

The so-called broadened V-coat, flattened V-coat or Vermeulen coat, as illustrated in FIG. 1, is a generally well known anti-reflective coating. This coating 6 comprises a stack consisting of four material layers. The first layer 1 which is situated farthest from the substrate, is a quarter-wave layer, which means that it has a thickness of about $\lambda_0/4$, $\lambda_0$ being the design wave-length of about 510 nm, which is the reciprocal mean visual wave-length. The second layer 2 is a halfwave layer, with a thickness of about $\lambda_0/2$. The third and fourth layers 3 and 4 which are situated closest to the substrate, are very thin material layers, typically with thicknesses of about $\lambda_0/12$ and $\lambda_0/16$ respectively. An example of such a coating is described in the patent U.S. Pat. No. 5,450,238.

In order to obtain optimum optical properties such as low reflectance and large band-width, the four-layer stack should combine materials with very low and very high refractive indices. Practically, silicondioxyde is used as material with very low refractive index (of about 1.46), and titaniumdioxyde is used as material with very high refractive index (of about 2.35).

The admittance plot of such a four-layer Vermeulen anti-reflective glass coating is shown in FIG. 2, relating to a stack consisting of a silicondioxyde layer with an optical thickness of $0.25\lambda_0$, situated farthest from the substrate, followed by a titaniumdioxyde layer with a thickness of $0.52\lambda_0$, a silicondioxyde layer with a thickness of $0.09\lambda_0$, and finally, closest to the substrate, a titaniumdioxyde layer with a thickness of $0.06\lambda_0$, $\lambda_0$ being about 510 nm. The corresponding reflectance diagram is shown as plot A in FIG. 7. As can be seen from these diagrams, the optical properties of this Vermeulen type coating are very good: a low reflectance over the visual wave-length range and a high band-width; the latter being defined as the ratio of the long wave-length $\lambda_L$ to the short wavelength $\lambda_S$ at a reflectance level of 1%.

A very important drawback of such coatings however, is their high electrical resistance (typically more than 20000 Ω/sq), making the coating not suitable for anti-static or EMI (Electro-Magnetic Interference) shielding applications, e.g. as coating for cathode ray tubes (CRT).

In order to improve the electrical conductivity of the coating, it is common to replace the titaniumdioxyde layers by electrically conductive material layers such as e.g. In- or Al-doped zincoxyde, Sb- or F-doped tinoxyde, Sn doped cadmiumoxyde, or indium-tinoxyde layers.

The optical properties of such modified Vermeulen coatings are however worse than those of the afore-mentioned Vermeulen coating, since the modified coatings comprise a stack which combines silicondioxyde with an electrically conductive material with lower refractive index than titaniumdioxyde (typically 2.0–2.1). The reflectance of the incident light is therefore higher, and the band-width lower. This can be seen from the reflectance plot B of FIG. 7, which is related to a modified Vermeulen glass coating comprising a stack consisting of a silicondioxyde layer with an optical thickness of $0.24\lambda_0$ which is situated farthest from the substrate, followed by an indium-tinoxyde layer with a thickness of $0.39\lambda_0$, a silicondioxyde layer with a thickness of $0.06\lambda_0$, and an indium-tinoxyde layer with a thickness of $0.07\lambda_0$, closest to the substrate. The corresponding admittance plot is illustrated in FIG. 3.

In the patent U.S. Pat. No. 5,270,858 a multilayer anti-reflective coating is described wherein the intermediate titaniumdioxyde layer of the Vermeulen coating is partially replaced by an electrically conductive material layer such as a doped zincoxyde or indium-tinoxyde layer, leading to a coating comprising a stack consisting of five material layers.

Although this coating has the advantage of being somewhat electrically conductive, it still has important drawbacks.

Since part of the titaniumdioxyde has been replaced by an electrically conductive material (with lower refractive index), the optical properties of the coating are worse than those of the Vermeulen coating described before. This can be seen from the reflectance plot C of FIG. 7, relating to a coating on glass comprising a stack consisting of a silicondioxyde layer with an optical thickness of $0.28\lambda_0$ farthest from the substrate, followed by a titaniumdioxyde layer with an optical thickness of $0.13\lambda_0$, followed by a zincoxyde layer with an optical thickness of $0.37\lambda_0$, followed by a silicondioxyde layer with an optical thickness of $0.12\lambda_0$, and finally followed by a titaniumdioxyde layer with an optical thickness of $0.03\lambda_0$ closest to the substrate.

Furthermore, the thickness of the electrically conductive material layer constituting the stack is very critical, and it should obey exactly the design specifications, since it has a direct influence on the optical properties of the coating. The electrical conductivity of the coating is therefore not adjustable at all and often not high enough to render the coating suitable for, EMI shielding applications.

OBJECT OF THE INVENTION

It is an object of the invention to provide an anti-reflective coating which is suitable for application on flexible substrates, and which has optimum optical properties, such as a low reflectance of incident light within the visual wave-length range and a high band-width.

It is also an object of the invention to provide an anti-reflective coating which is electrically conductive, and suitable for anti-static and EMI shielding applications.

It is a further object of the invention to provide an anti-reflective coating with an electrical conductivity that is adjustable, independently from the optical properties of the coating.

It is still a further object of the invention to provide a method for coating a substrate with an anti-reflective coating at a reasonable speed, making the coating process suitable for industrial application.

SUMMARY OF THE INVENTION

The present invention comprises a multilayer inorganic anti-reflective coating with predetermined optical properties, for application on a flexible substrate. The coating comprises a stack consisting of five material layers, whereby the third layer is a dummy layer consisting of an electrically conductive material, preferably indium-tinoxyde, which provides the coating with an adjustable electrical sheet resistance (i.e. the resistance of one square of the coating) of between 25 and 2000 Ω/sq without thereby influencing its optical properties. A dummy layer is defined as a layer of which the thickness has no or very little influence on the optical properties of the coating.

The first layer, situated farthest from the substrate, has a refractive index less than the refractive index of the substrate, and an optical thickness which is comprised between 0.2 and $0.3\lambda_0$, this means about $0.25\lambda_0$ (a quarterwave). The second layer has a refractive index greater than about 2.2 and an optical thickness which is comprised between 0.4 and $0.6\lambda_0$, i.e. of about $0.5\lambda_0$ (a halfwave). The fourth layer has a refractive index which is about the same as the refractive index of the first layer, and an optical thickness of less than about $0.1\lambda_0$, i.e. in any event less than $0.15\lambda_0$. The fifth layer has a refractive index which is about the same as the refractive index of said second layer, and an optical thickness which is comprised between 0.025 and $0.1\lambda_0$, i.e. of about $0.04\lambda_0$, $\lambda_0$ being the design wave-length which is comprised between 480 and 560 nm, i.e. which is about 510 nm.

The anti-reflective coating according to the invention can be applied onto a flexible substrate (e.g. a polymer film) by means of a single or double pass vacuum magnetron sputtering operation which can be performed in a vacuum chamber comprising:

(1) a section for unwinding and rewinding the flexible substrate;
(2) deposition sections wherein the material layers constituting the coating are sputtered onto the substrate;
(3) a central cooling drum, on the surface of which the substrate moves through the deposition sections.

In case a single pass operation is performed, minimum five deposition sections are required; in case a double pass operation is applied, only minimum three deposition sections are needed.

The invention will now be described in more detail, referring to the following drawings.

DETAILED DESCRIPTION OF THE INVENTION

Figure 7:
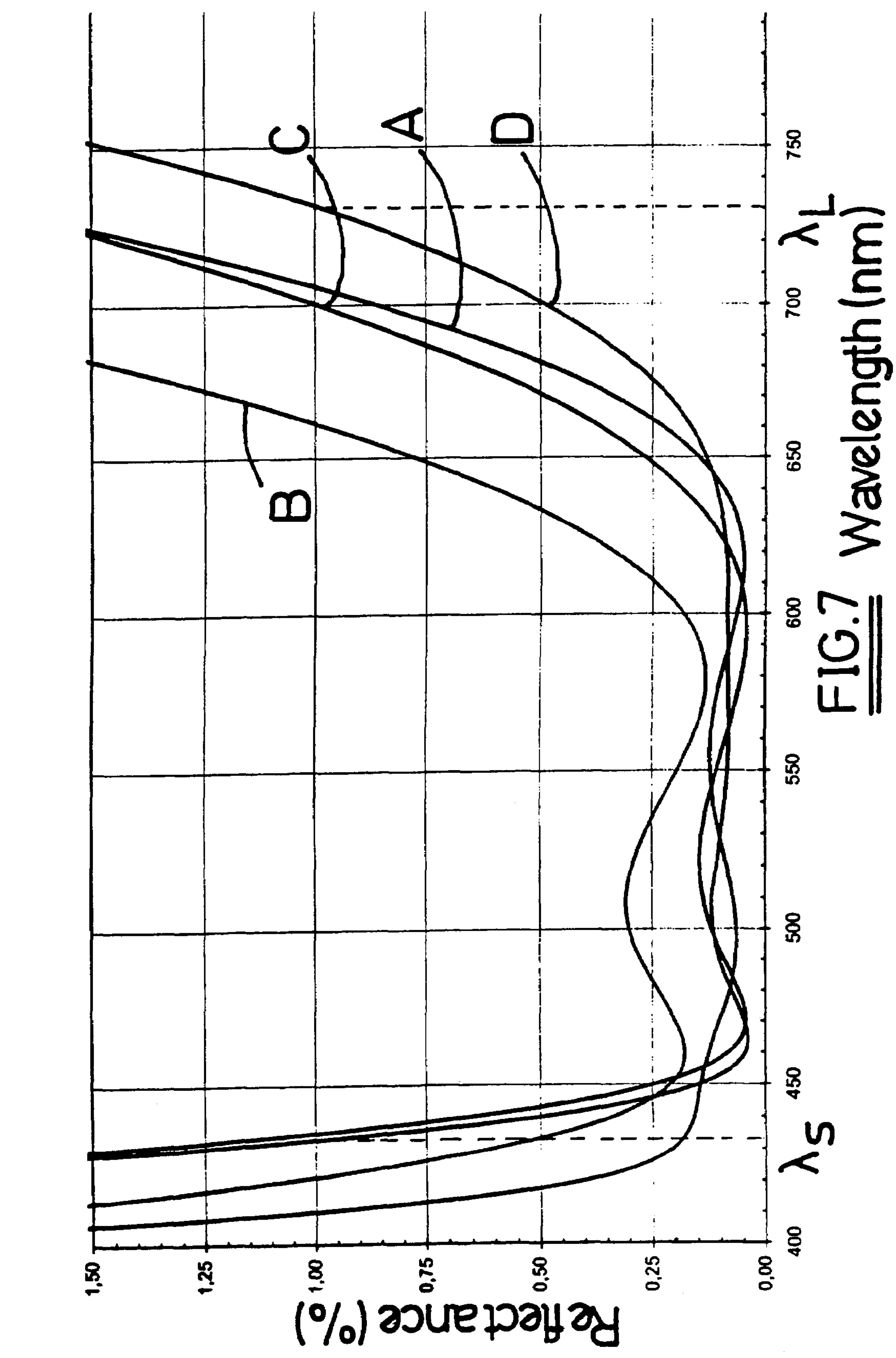
FIG. 7 represents the reflectance plots of a four-layer Vermeulen coating (A), a modified four-layer Vermeulen coating (B), and a five-layer conductive coating (C), all being part of the state of the art, and of a five-layer coating according to the invention (D).

In the description below the "optical properties" includes especially the reflectance, i.e. the percentage reflection of incident light, and the band-width BW, i.e. the ratio of the long wave-length $\lambda_L$ to the short wave-length $\lambda_S$ at a reflectance level of 1% ($BW=\lambda_L/\lambda_S$), as e.g. indicated on the reflectance plot D of FIG. 7.

Figure 1:
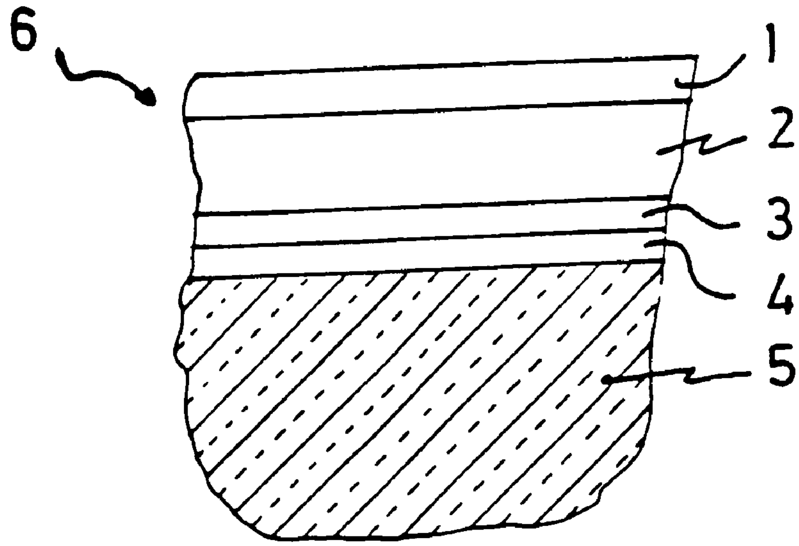
FIG. 1 schematically illustrates the constitution of a four-layer Vermeulen coating (state of the art).
Figure 2:
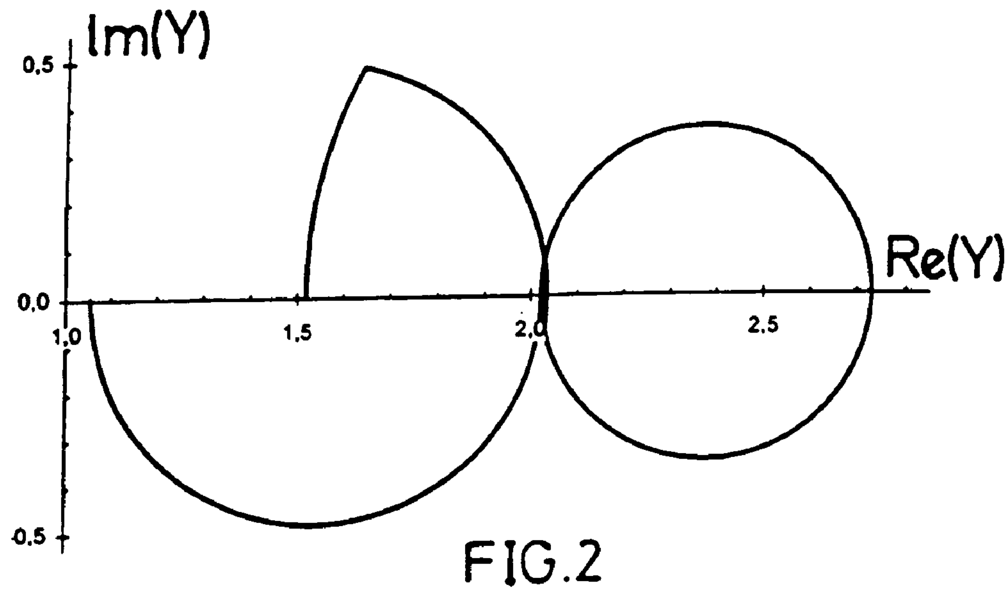
FIG. 2 shows the admittance plot of a four-layer Vermeulen coating (state of the art).
Figure 3:
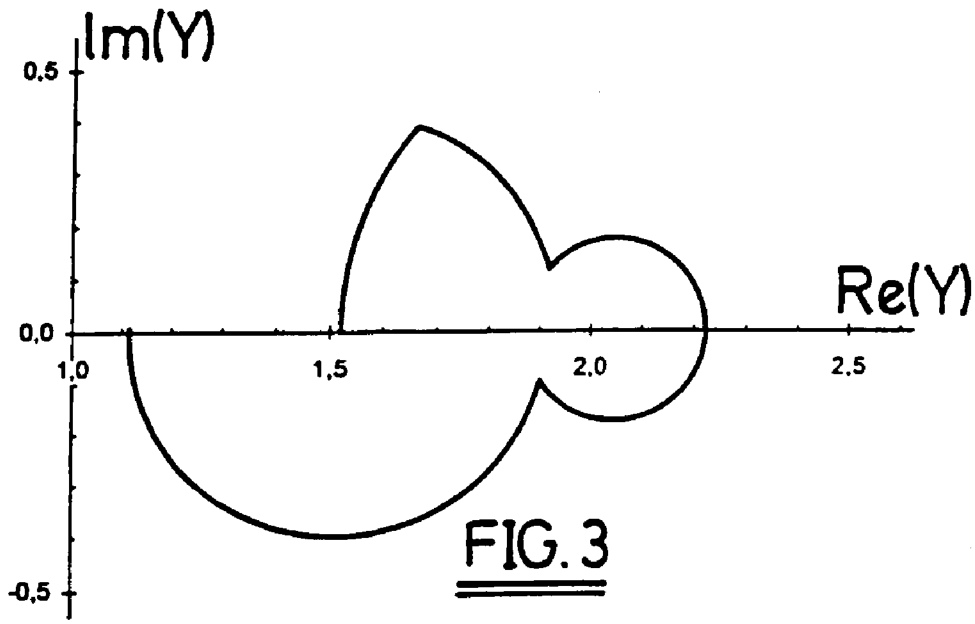
FIG. 3 graphically illustrates the admittance plot of a modified four-layer Vermeulen coating (state of the art).
Figure 4:
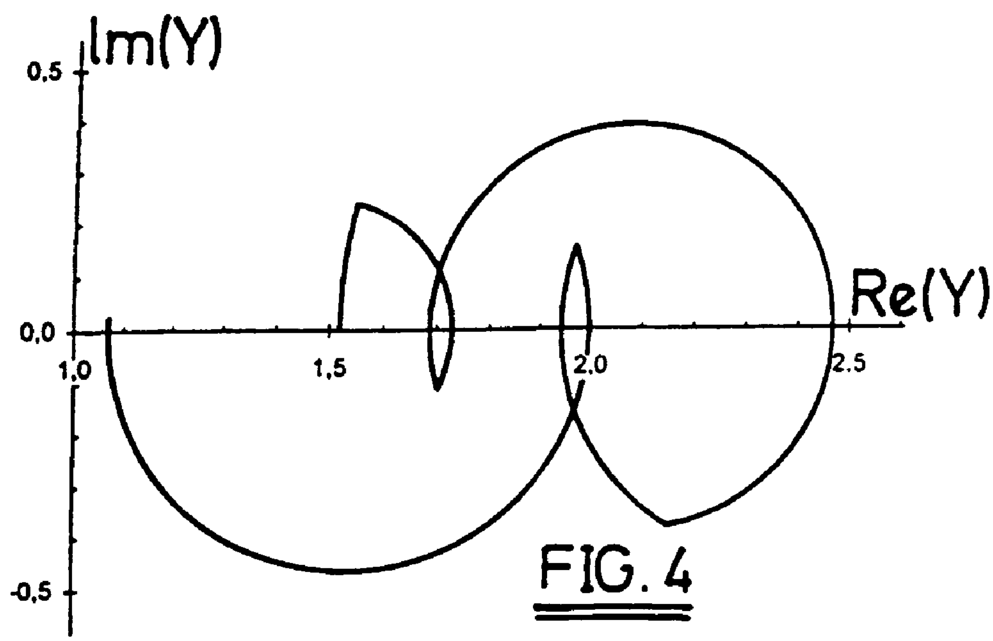
FIG. 4 illustrates the admittance plot of a conductive five-layer coating (state of the art).
Figure 5:
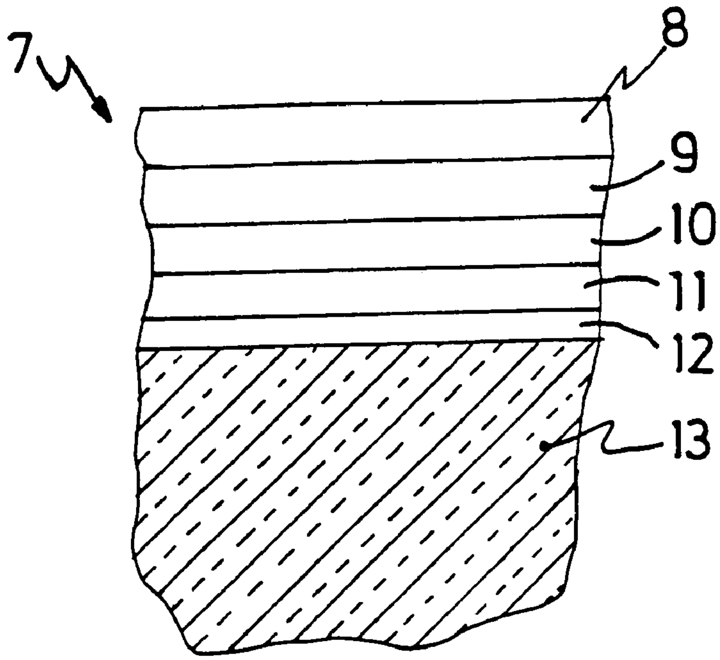
FIG. 5 schematically illustrates the constitution of an anti-reflective five-layer coating according to the invention.

According to the invention, a multilayer anti-reflective coating 7 for flexible substrates is proposed, comprising a stack consisting of five material layers, as shown in FIG. 5.

The first layer 8 is situated farthest from the substrate, consists of a material with a refractive index less than the refractive index of the substrate, and has an optical thickness which is comprised between 0.2 and $0.3\lambda_0$, typically of about $0.25\lambda_0$ (a quarterwave).

The thickness is expressed as a fraction of $\lambda_0$, about 510 nm, the reciprocal mean of the boundery wave-lengths limiting the visual wave-length region, viz. from 400 nm to 700 nm.

The second layer 9 which is comprised in the coating, consists of a material with a refractive index which is greater than about 2.2, and has an optical thickness which is comprised between 0.4 and $0.6\lambda_0$, typically of about $0.5\lambda_0$ (a halfwave).

The third layer 10 consists of an electrically conductive material, and will be characterised in detail furtheron.

The fourth layer 11 consists of a material with a refractive index which is about the same as the refractive index of the first layer 8, and has an optical thickness of less than about $0.1\lambda_0$, typically comprised between 0.05 and $0.15\lambda_0$.

The fifth layer 12, closest to the substrate 13, consists of a material with a refractive index which is about the same as the refractive index of the second layer 9, and has an optical thickness which is comprised between 0.025 and $0.1\lambda_0$, typically of about $0.05\lambda_0$.

The stack preferably combines titaniumdioxyde and silicondioxyde as materials with respectively very high and low refractive indices, providing the coating with good optical properties, which are comparable to those of the aforementioned four-layer Vermeulen coating. This can be seen from the reflectance plot D of FIG. 7, which is related to a coating according to the invention, as characterised in Example 2 below.

The use of titaniumdioxyde for the fifth layer 12 closest to the substrate 13, has the additional advantage that it gives said layer moisture barrier properties, preventing moisture from outside to penetrate through the interface between the substrate and the fifth layer 12, and so preventing coating stack degradation such as crack formation.

The anti-reflective coating according to the invention yields a photopic reflectance that does not exceed 0.15%, when applied on transparent PET-films or 0.25% on substrates having a hardcoat, e.g. consisting of highly cross-linked UV-cured acrylates. The photopic reflection is the convolution of the eye sensitivity and the reflectance plot, and is measured in the wavelength region from 380 to 780 nm using a standard illuminant D65 and the 20 observer defined by the Commission Internationale de I'Eclairage in 1931.

Furthermore, the coating has a band-width (as defined above) of more than about 1.60, which is larger than the band width of most conventional coatings for flexible substrates. In reality however, small and/or local deviations in layer thicknesses or in refractive indexes (as a consequence of small deviations in layer compositions) may result in an increase of the photopic reflection values. These values may rise up to about 0.60% when applied onto a flexible and transparent substrate or up to about 0.70% when applied onto a hardcoated flexible substrate. Preferably the values should not exceed 0.60% resp. 0.70% and most preferably they should not exceed 0.45% resp. 0.55%.

The third material layer 10 in the coating stack according to the invention, consists of an electrically conductive material, giving the anti-reflective coating the desired electrical conductivity.

This layer is a so-called "dummy layer", which means that its thickness has no or very little influence on the optical properties of the coating. By changing the thickness of this dummy layer, the electrical conductivity of the coating can be adjusted within a broad range, without influencing the optical properties of the coating.

A layer acts as dummy layer if it is inserted in the stack at a position where the complex optical admittance Y of the stack takes a real value, and if the refractive index of the inserted layer is equal to said real value.

Figure 6:
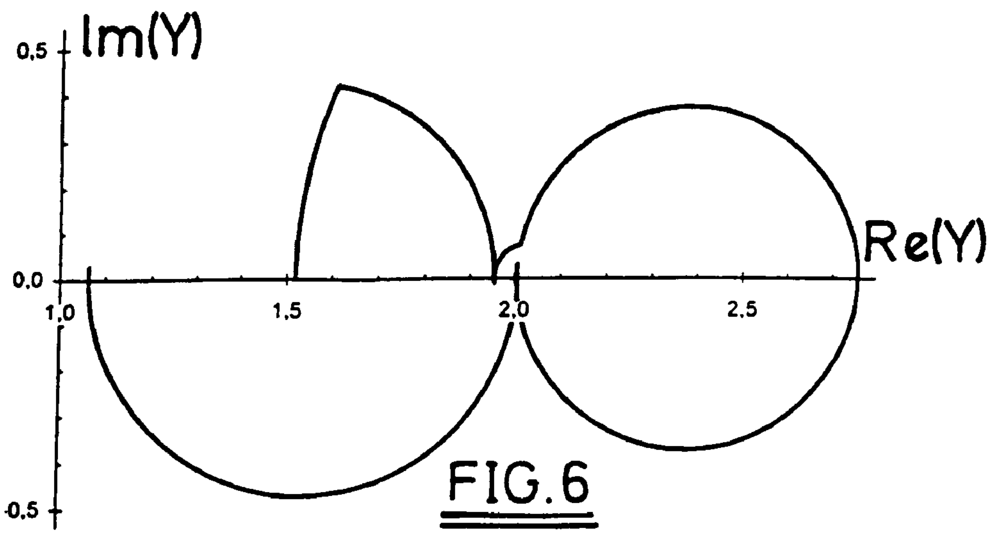
FIG. 6 shows the admittance plot of an anti-reflective five-layer coating according to the invention.

After depositing the fifth and fourth stack layers 11 and 12 onto the substrate, the nascent stack has a real admittance of about two, as can be seen from the admittance diagram of FIG. 6. If at this point a layer is inserted of a material with a refractive index of about two, the admittance diagram continues as a circle with extremely small radius (or ideally a point), meaning that the optical properties of the coating remain virtually unchanged. As indium-tinoxyde (ITO) has a refractive index of about two, it is very suitable for the above-said purpose. An ITO layer inserted as third layer in the stack constituting the anti-reflective coating according to the invention, acts therefore as a dummy layer.

The ITO dummy layer is electrically conductive, and provides the coating with an adjustable electrical conductivity. Indeed, by varying the thickness of the ITO dummy layer between 5 and 50 nm, and preferably between 20 and 40 nm, the electrical sheet resistance of the coating can be adjusted between 25 and 2000 Ω/sq, without influencing the optical properties of the coating. For application e.g. on cathode ray tubes, the electrical sheet resistance of the coating is preferably very low, between 25 and 500 Ω/sq.

The electrical sheet resistance is defined as the resistance of a conductor with a surface area of one square (length=width), which can be calculated as the ratio of the resistivity of the conductive layer and the thickness of the conductive coating layer.

It is an additional advantage of the coating according to the invention that its colour is adjustable and reproducible. Since the optical properties of the proposed coating are not very sensitive to small changes in thickness of its constituting stack layers and/or in the stoechiometry of the materials, fine-tuning of the colour is possible.

EXEMPLARY EMBODIMENTS OF THE INVENTION

Some non-limiting embodiments of the anti-reflective coating according to the invention are given below.

EXAMPLE 1

An anti-reflective coating comprising a stack with a composition as given in Table 1, has a band-width of 1.75 and leads to a photopic reflection (as defined above) of 0.094% when applied onto a (transparent) polyethyleneterephtalate (PET) film as substrate, and to a photopic reflection of 0.175% when applied onto a hardcoated PET film as substrate. The hardcoat consists of highly cross-linked UV-cured acrylates, and has a thickness of about 3.5 μm. The reflectance plot relating to this coating is shown as plot E in FIG. 8.

The coating has an electrical sheet resistance of less than about 250 Ω/sq, depending on the exact composition of the deposited ITO material.

TABLE 1

| Layer | Material | Refractive Index | Optical Thickness |
|---|---|---|---|
| | <Air> | | |
| 1 | $SiO_2$ | 1.46 | $0.26\lambda_0$ |
| 2 | $TiO_2$ | 2.35 | $0.50\lambda_0$ |
| 3 | ITO | 2.03 | $0.10\lambda_0$ |
| 4 | $SiO_2$ | 1.46 | $0.09\lambda_0$ |
| 5 | $TiO_2$ | 2.35 | $0.05\lambda_0$ |
| | <Substrate> | | |

EXAMPLE 2

An anti-reflective coating comprising a stack with a composition as given in Table 2, has a band-width of 1.65 and leads to a photopic reflection (as defined above) of 0.094% when applied onto a polyethyleneterephtalate (PET) film as substrate, and to a photopic reflection of 0.172% when applied onto a hardcoated PET film as substrate. The hardcoat consists of highly cross-linked UV-cured acrylates, and has a thickness of about 3.5 μm. The reflectance plot relating to this coating is shown as plot F in FIG. 8, or plot D in FIG. 7.

The coating has an electrical sheet resistance of less than about 200 Ω/sq, depending on the exact composition of the deposited ITO material.

TABLE 2

| Layer | Material | Refractive Index | Optical Thickness |
|---|---|---|---|
| | <Air> | | |
| 1 | $SiO_2$ | 1.46 | $0.26\lambda_0$ |
| 2 | $TiO_2$ | 2.35 | $0.49\lambda_0$ |
| 3 | ITO | 2.03 | $0.12\lambda_0$ |
| 4 | $SiO_2$ | 1.46 | $0.09\lambda_0$ |
| 5 | $TiO_2$ | 2.35 | $0.05\lambda_0$ |
| | <Substrate> | | |

EXAMPLE 3

The anti-reflective coating comprising a stack with a composition as given in Table 3, has a band-width of 1.64 and leads to a photopic reflection (as defined above) of 0.087% when applied onto a polyethyleneterephtalate (PET) film as substrate, and to a photopic reflection of 0.166% when applied onto a hardcoated PET film as substrate. The hardcoat consists of highly cross-linked UV-cured acrylates, and has a thickness of about 3.5 $\mu$m. The reflectance plot relating to this coating is shown as plot G in FIG. 8.

The coating has an electrical sheet resistance of 175 Ω/sq, depending on the exact composition of the deposited ITO material.

TABLE 3

| Layer | Material | Refractive Index | Optical Thickness |
|---|---|---|---|
| | <Air> | | |
| 1 | $SiO_2$ | 1.46 | $0.26\lambda_0$ |
| 2 | $TiO_2$ | 2.35 | $0.46\lambda_0$ |
| 3 | ITO | 2.03 | $0.14\lambda_2$ |
| 4 | $SiO_2$ | 1.46 | $0.09\lambda_0$ |
| 5 | $TiO_2$ | 2.35 | $0.04\lambda_0$ |
| | <Substrate> | | |

EXAMPLE 4

The anti-reflective coating comprising a stack with a composition as given in Table 4, has a band width of 1.6 and leads to a photopic reflection (as defined above) of 0.081% when applied onto a polyethyleneterephtalate (PET) film as substrate, and to a photopic reflection of 0.161% when applied onto a hardcoated PET film as substrate. The hardcoat consists of highly cross-linked UV-cured acrylates, and has a thickness of about 3.5 $\mu$m. The reflectance plot relating to this coating is shown as plot H in FIG. 8.

The coating has an electrical sheet resistance of 150 Ω/sq, depending on the exact composition of the deposited ITO material.

TABLE 4

| Layer | Material | Refractive Index | Optical Thickness |
|---|---|---|---|
| | <Air> | | |
| 1 | $SiO_2$ | 1.46 | $0.26\lambda_0$ |
| 2 | $TiO_2$ | 2.35 | $0.46\lambda_0$ |
| 3 | ITO | 2.03 | $0.16\lambda_0$ |
| 4 | $SiO_2$ | 1.46 | $0.10\lambda_0$ |
| 5 | $TiO_2$ | 2.35 | $0.04\lambda_0$ |
| | <Substrate> | | |

Figure 8:
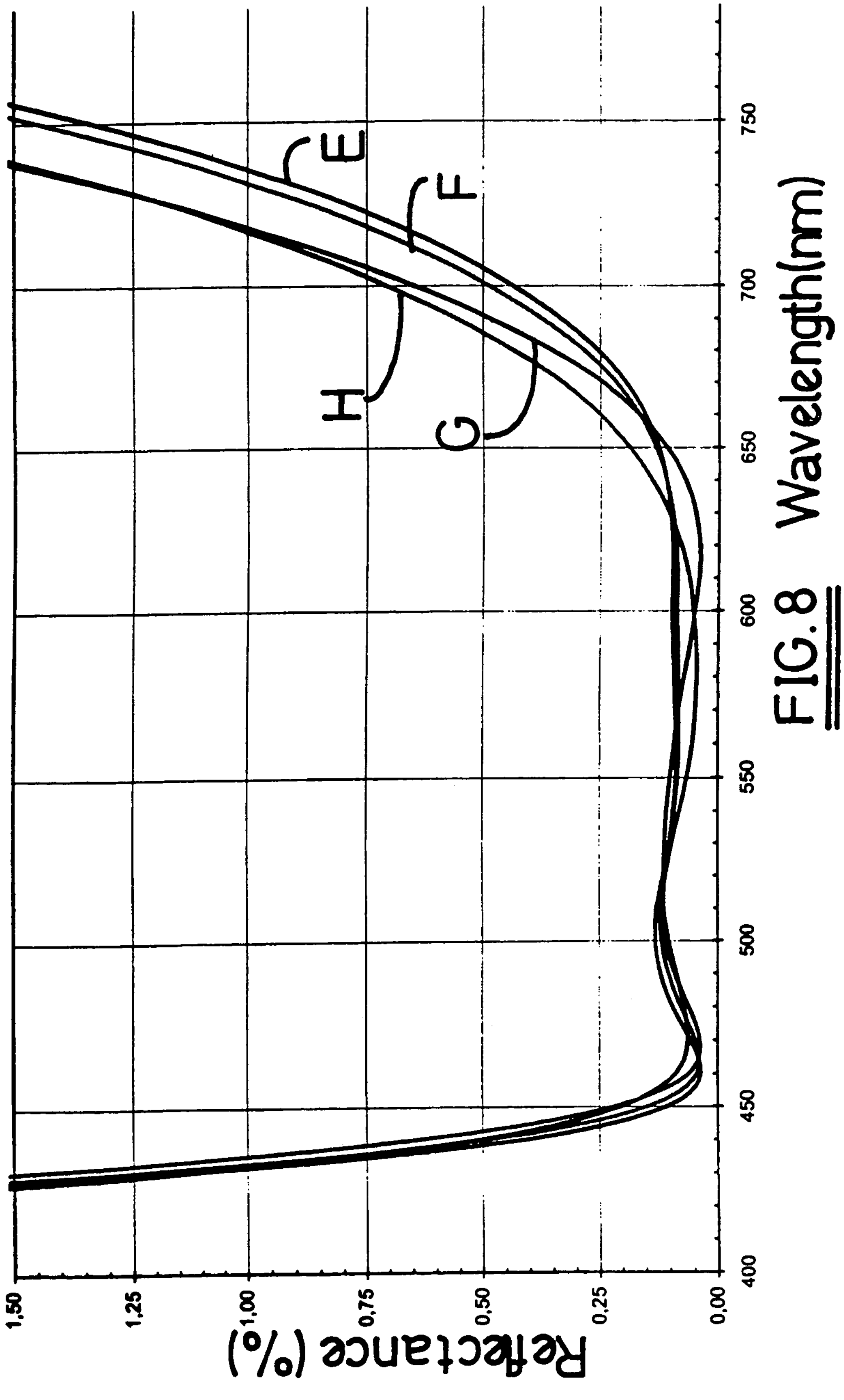
FIG. 8 shows the reflectance plots of four 5-layer conductive coatings (on a transparent PET-film as substrate) according to the invention, comprising a dummy indium-tinoxyde layer with a physical thickness of 25 nm (E), 30 nm (F), 35 nm (G) and 40 nm (H) respectively.

The examplary coating stacks mentioned in Tables 1 to 4, differ from each other in the thickness of the ITO dummy layer; the proposed coatings comprise an ITO layer with a physical thickness of 25, 30, 35 and 40 nm respectively. FIG. 8, which combines the reflectance plots of these four coatings, demonstrates that the thickness of the ITO layer does virtually not influence the reflectance properties of the coating, confirming the statement that the ITO layer is a dummy layer. On the other hand, the thickness of the ITO layer has a direct influence on the electrical sheet resistance of the coating; the electrical sheet resistance of the coating comprising an ITO layer with a physical thickness of 40 nm is about 1.6 times lower than that of the coating with an ITO layer of 25 nm.

EXAMPLE 5

An anti-reflective coating stack according to the present invention comprising a stack with a composition as given in Table 5 was deposited in two passes on a large web coater or roll-coater with three deposition sections. The coating stack was uniform over a width of about 1000 mm and had the following characteristics:

- average spectral reflection in the range 450–650 nm: 0.30–0.36%
- maximum reflectance in the wave-length range 450–650 nm 0.51–1.62%
- band-width: 1.55–1.58
- photopic reflectance: 0.33%

The sheet resistance of this coating was about 500 Ω/sq

TABLE 5

| Layer | Material | Refractive Index | Optical Thickness |
|---|---|---|---|
| | <Air> | | |
| 1 | $SiO_2$ | 1.50 | $0.25\lambda_0$ |
| 2 | $TiO_2$ | 2.41 | $0.51\lambda_0$ |
| 3 | ITO | 2.03 | $0.13\lambda_0$ |
| 4 | $SiO_2$ | 1.50 | $0.06\lambda_0$ |
| 5 | $TiO_2$ | 2.41 | $0.04\lambda_0$ |
| | <Substrate> | | |

According to the invention, there is also proposed a method for coating a flexible substrate with an anti-reflective coating, whereby the coating is applied onto the substrate by means of a single or double pass vacuum magnetron sputtering operation in a vacuum web coater. This sputtering operation can be performed in a vacuum chamber 20 comprising:

(1) a section 30 for unwinding and rewinding the flexible substrate;

(2) deposition sections wherein the material layers constituting the coating are consecutively sputtered onto the substrate;

(3) a central cooling drum 24, on the surface of which the substrate moves through the deposition sections. The vacuum web coater can be a large web coater or a roll coater with e.g. three or five deposition sections.

Different sputter magnetrons can be used for obtaining the coating according to the invention. For example, rotatable or planar magnetrons using silicon, titanium and In/Sn-alloy (90/10, wt %) targets can be used for reactive sputtering in an $Ar/O_2$ atmosphere.

It is however preferred to sputter the titaniumdioxyde layers from a (oxygen deficient) $TiO_x(x<2)$ rotatable ceramic target fixed on a cylindrical support.

In the prior art it is avoided to sputter from titaniumdioxyde ($TiO_2$) targets, because the sputter rate from a conventional planar titaniumdioxyde target is very low, and also because the power applied to the target has to be kept low, making the process not suitable for industrial application. In DC-mode, the power density on the target has to be low to prevent arcing due to the low conductivity of the titaniumdioxyde target. In RF-mode the power density on the target should be kept low for shielding reasons, to avoid electromagnetic interference around the sputter web coater. As titaniumdioxyde leads to better optical properties than other materials because of its very high refractive index, it is however desirable to use titaniumdioxyde instead of any other substitute material.

Theoretically, titaniumdioxyde can be deposited by DC (or RF) reactive sputtering in an oxygen rich plasma from planar or rotatable titanium targets. It has however been shown that this way of operating makes it very difficult to obtain stoechiometric titaniumdioxyde material layers, even when high oxygen flow rates are applied (which can lead to arcing and low deposition rates). Using an understoechiometric rotatable $TiO_x$ ($x<2$) target the sputter rate is however enhanced, and stoechiometric titaniumdioxyde layers are obtained, with little addition of oxygen to the plasma.

Furthermore, starting from an understoechiometric target material, titaniumdioxyde is deposited as rutile rather than as anatase, yielding better optical properties, as the refractive index of rutile is even somewhat higher than that of anatase.

Using a single pass operation, the five layers 8 to 12 constituting the stack ($TiO_2$—$SiO_2$—ITO—$TiO_2$—$SiO_2$, starting from the substrate) are sputtered consecutively onto the substrate, in five separate and adjacent deposition sections.

Figure 9:
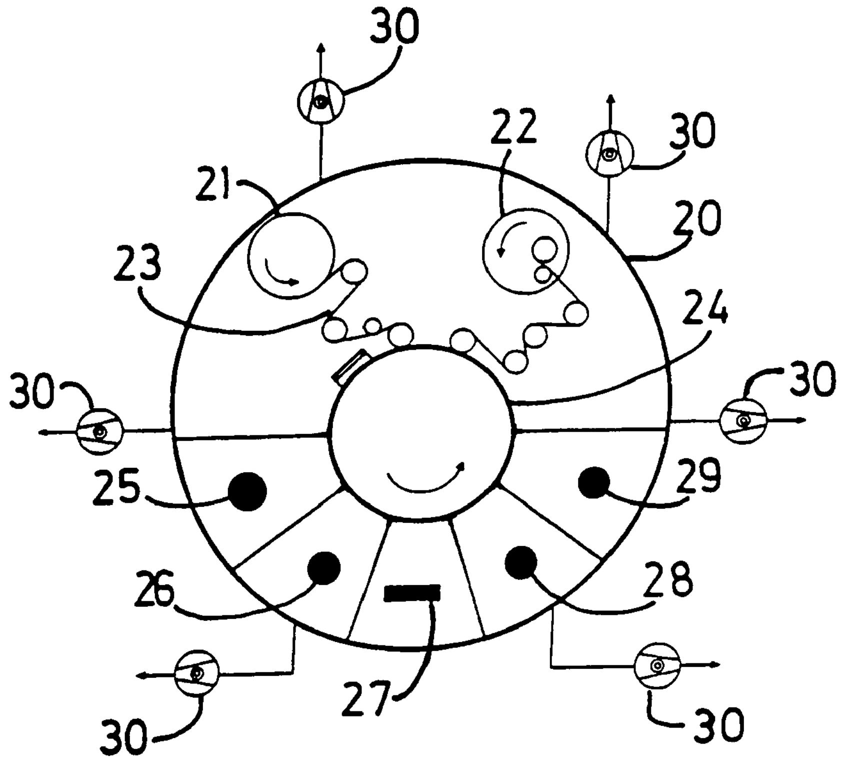
FIG. 9 illustrates schematically a single pass sputtering process for coating a flexible substrate with an anti-reflective coating according to the invention.

A possible single pass operation is illustrated in FIG. 9. Vacuum pumps create a vacuum in the chamber 20 comprising the unwinding roll 21 and the rewinding roll 22 for the flexible substrate 23, the sputtering sources or targets 25 to 29, and the cooling drum 24. The flexible substrate 23 is unwound from the unwinding roll 21, and moves on the surface of the cooling drum 24 through the deposition sections, and is finally rewound on the rewinding roll 22. The material layer which has to be closest to the substrate, the fifth layer, is sputtered first from a rotatable $TiO_x$ target 25. In the next deposition sections, the fourth, third, second and first layers of the stack are consecutively sputtered, respectively from a rotatable silicon target 26, a planar indium/tin or ITO target 27, a rotatable $TiO_x$ target 28, and a rotatable silicon target 29.

Using a double pass operation, the two material layers to be deposited closest to the substrate ($TiO_2$—$SiO_2$) are sputtered during the first pass of the substrate through the deposition sections, and the remaining three material layers (ITO—$TiO_2$—$SiO_2$) are sputtered during the second pass. This implies that a double pass operation requires only three deposition sections.

Figure 10:
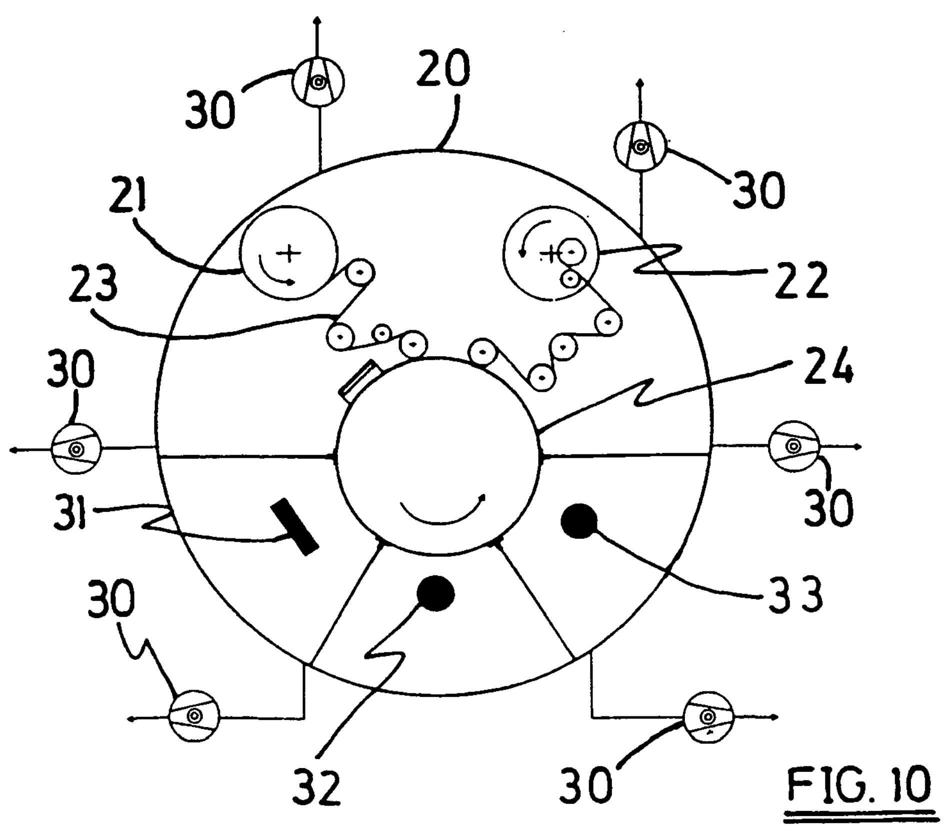
FIG. 10 illustrates schematically a double pass sputtering process for coating a flexible substrate with an anti-reflective coating according to the invention made on a wide web coater or roll coater.
Figure 11:
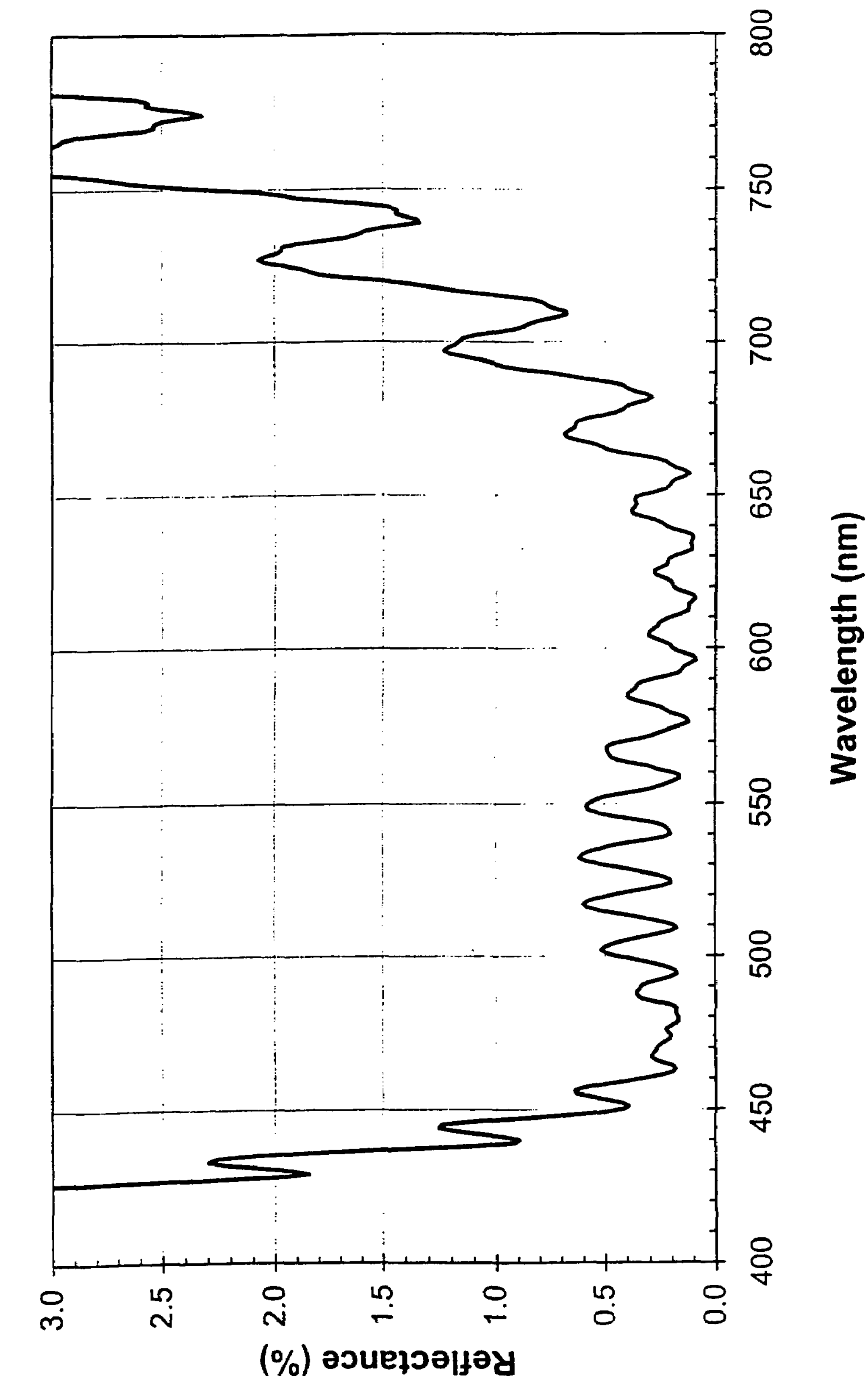
FIG. 11 shows the reflectance plot of a five-layer conductive coating according to the invention in which a dummy indium- tinoxyde layer with a physical thickness of about 25 nm is used and deposited on a hard-coated PET-substrate. This coating has been made on a wide web coater or roll-coater (substrate width 1200 mm) with five deposition chambers.

FIG. 10 illustrates a possible double pass operation. The fifth and fourth layers of the stack constituting the coating are sputtered during the first pass of the flexible substrate 23 through the deposition sections, from a rotatable $TiO_x$ target 32 and a rotatable silicon target 33 respectively. During a second pass, material layers are sputtered from a planar indium/tin or ITO target 31, a rotatable $TiO_x$ target 32 and a rotatable silicon target 33 consecutively onto the substrate 23.

It will be clear from the above description that each of the rotatable magnetrons can be replaced by a planar magnetron and vice-versa.

The anti-reflective coating according to the invention can be successfully used as a coating for a polymer film which constitutes the front surface of a cathode ray tube (both in television applications or computer monitors), or of a liquid crystal display.

What is claimed is:

1. A multilayer inorganic anti-reflective coating for application on a flexible substrate, wherein said coating comprises a stack comprising five material layers, respectively designated as the first, second, third, fourth, and fifth layer, starting from the layer situated farthest from the substrate, said second layer being in direct contact with said third layer and said third layer being in direct contact with said fourth layer, wherein said first layer has a refractive index less than the refractive index of said substrate and an optical thickness between 0.2 and $0.3\lambda_0$, wherein said second layer has a refractive index greater than 2.2 and an optical thickness between 0.4 and $0.6\lambda_0$, wherein said fourth layer has a refractive index which is substantially the same as the refractive index of said first layer and an optical thickness of less than $0.1\lambda_0$, wherein said fifth layer has a refractive index which is substantially the same as the refractive index of said second layer and has an optical thickness of between 0.025 and $0.1\lambda_0$, wherein $\lambda_0$ is about 510 nm, wherein said third layer comprises an electrically conductive material which provides said coating with an adjustable electrical sheet resistance of between 25 and 2000 Ω/sq, wherein said third layer is disposed in the coating at a position where the optical admittance Y of the coating takes a real value, and wherein said conductive material has a refractive index approximating said real value, so that the optical properties of the coating are not influenced by the presence of said third layer.

2. The anti-reflective coating according to claim 1, having an electrical sheet resistance between 25 and 500 Ω/sq.

3. The anti-reflective coating according to claim 1, wherein said third layer comprises indium-tin-oxide.

4. The anti-reflective coating according to claim 1, wherein the thickness of said third layer is between 5 and 50 nm.

5. The anti-reflective coating according to claim 4, wherein the thickness of said third layer is between 20 and 40 nm.

6. The anti-reflective coating according to claim 1, wherein said first and fourth layers comprise silicon dioxide, and wherein said second and fifth layers comprise titanium dioxide.

7. The anti-reflective coating according to claim 1, wherein the fifth layer has moisture barrier properties.

8. A method for coating a flexible substrate with an anti-reflective coating according to claim 1, comprising applying said coating by a single pass vacuum magnetron sputtering operation in a vacuum chamber, wherein the vacuum chamber comprises:

(1) a section for unwinding and rewinding the flexible substrate;

(2) five deposition sections configured so that the five material layers are consecutively sputtered onto the substrate in said deposition sections; and (3) a central cooling drum, configured so that the substrate moves through said deposition sections on a surface of said drum.

9. A method for coating a flexible substrate with an anti-reflective coating according to claim 1, comprising applying said coating by a double pass vacuum magnetron sputtering operation in a vacuum chamber, wherein the vacuum chamber comprises:

(1) a section for unwinding and rewinding the flexible substrate;

(2) three deposition sections configured so that the five material layers are consecutively sputtered onto the substrate in said deposition sections; and (3) a central cooling drum, configured so that the substrate moves through said deposition sections on a surface of said drum.

10. A method according to claim 8, wherein at least one deposition section comprises one of a rotatable and a planar TiOx target.

11. Use of an anti-reflective coating according to claim 1, as coating for a polymer film which constitutes a front surface of a cathode ray tube (CRT).

12. A method according to claim 9, wherein at least one deposition section comprises one of a rotatable and a planar TiOx target.

* * * * *